(12) United States Patent
Yamakawa

(10) Patent No.: US 8,203,397 B2
(45) Date of Patent: *Jun. 19, 2012

(54) ATTENUATOR

(75) Inventor: Junjirou Yamakawa, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/137,055

(22) Filed: Jul. 18, 2011

(65) Prior Publication Data

US 2011/0273218 A1    Nov. 10, 2011

Related U.S. Application Data

(62) Division of application No. 12/929,328, filed on Jan. 14, 2011, which is a division of application No. 12/289,823, filed on Nov. 5, 2008, now abandoned.

(30) Foreign Application Priority Data

Nov. 27, 2007    (JP) ................................. 2007/305830

(51) Int. Cl.
*H03H 7/24* (2006.01)
*H01P 1/22* (2006.01)

(52) U.S. Cl. ...................................... 333/81 R; 327/308
(58) Field of Classification Search ................ 333/81 R, 333/81 B, 22 R; 327/308
See application file for complete search history.

(56) References Cited

U.S. PATENT DOCUMENTS

| 4,216,445 A | 8/1980 | Abajian |
| 4,222,066 A | 9/1980 | Zelenz |
| 8,031,031 B2 * | 10/2011 | Yamakawa ................. 333/81 R |
| 2009/0079489 A1 * | 3/2009 | Zhang et al. ................. 327/308 |

FOREIGN PATENT DOCUMENTS

JP    2000-286659    10/2000

* cited by examiner

*Primary Examiner* — Stephen Jones
(74) *Attorney, Agent, or Firm* — McGinn IP Law Group, PLLC

(57) ABSTRACT

An attenuator includes a first terminal, a second terminal, a first circuit coupled between the first and second terminals and including a field effect transistor including a gate terminal coupled to a resistor, a second circuit coupled between the first circuit and the second terminal and coupled to the first circuit via a node, and a third circuit coupled to the node.

6 Claims, 9 Drawing Sheets

ATTENUATOR

The present application is a Divisional Application of U.S. patent application Ser. No. 12/929,328, filed on Jan. 14, 2011, which is a Divisional Application of U.S. patent application Ser. No. 12/289,823, filed on Nov. 5, 2008, now abandoned which is based on Japanese patent application No. 2007-305830, filed on Nov. 27, 2007, the entire contents of which is incorporated herein by reference.

BACKGROUND OF THE INVENTION

1. Field of the Invention

The present invention relates to an attenuator, and more particularly relates to an attenuator having a circuit element that adjusts the attenuation characteristic of the attenuator.

2. Description of the Related Art

An attenuator has been known as a circuit having a function to attenuate a gain of an input signal, and is used for a cellular phone, for example. In the cellular phone, for example, an attenuator is provided between an antenna that receives a signal and a low noise amplifier that adjusts a gain of the received signal. In this case, the attenuator has a role to attenuate the gain of the input signal so that the gain of the received signal may not exceed the dynamic range of the low noise amplifier. Recently, it has been required to perform communications by using a high frequency signal in wideband such as ultra wideband communications systems. Thus, an attenuator capable of handling wideband high-frequency signals has been required. However, in some cases, the attenuation characteristic of an attenuator may be sharply changed depending on the frequency of an input signal under the influence of a parasitic element component of a circuit element which constitutes the attenuator. This is because the impedance of the parasitic element component changes relative to the frequency of the input signal. As the frequency of the input signal increases, a change in the attenuation characteristic of the attenuator becomes large. If the amount of attenuation of the gain of the input signal changes greatly depending on the frequency of the input signal, the low noise amplifier that receives an output signal from the attenuator has to have a complicated circuit configuration such that the amplifier can correspond to the change in the gain of the output signal of the attenuator. Thus, it is important to adjust the attenuation characteristic of the attenuator and to design the attenuator capable of handling wideband high-frequency signals.

There are mainly two kinds of attenuator configurations. One is a Π-type attenuator and the other is a T-type attenuator. In the Π-type attenuator, circuit elements are connected in the form of a Π-type circuit in a two terminal pair network. Meanwhile, in the T-type attenuator, circuit elements are connected in the form of a T-type circuit in a two terminal pair network. Japanese Patent Application Publication No. 2000-286659 (Patent Document 1) discloses a technique related to an attenuator in which then-type attenuator is combined with the additional T-type attenuator. FIG. 11 shows the attenuator described in Patent Document 1. This attenuator adjusts the amount of attenuation of an input signal by adjusting a value of a control voltage applied to a control terminal 1008 and a value of a bias voltage applied to a bias terminal 1021. For example, Patent Document 1 describes an attenuation technique in which while the bias voltage is applied to the bias terminal 1021 to drive PIN diodes 1004, 1006, 1010, 1012, and 1014, the value of the control voltage applied to the control terminal 1008 is increased. Thereby, internal resistances in the PIN diodes 1010, 1012, and 1014 are decreased, while internal resistances in the PIN diodes 1004 and 1006 are increased, so that the amount of attenuation of the gain of the input signal received at an input terminal is increased. In other words, in the technique described in Patent Document 1, the attenuation characteristic of an attenuator 1000 is adjusted by adjusting the balance between the control voltage to be applied to the control terminal 1008 and the bias voltage to be applied to the bias terminal 1021.

The present inventor has found that the conventional technique according to Patent Document 1 has the following problem. As described above, it is important to adjust the attenuation characteristic of an attenuator, and to design the attenuator capable of handling wideband high-frequency signals. However, in the technique described in Patent Document 1, the attenuation characteristic of the attenuator is adjusted by the values of the voltages to be applied to the control terminal and the bias terminal. In this case, for example, a step-down circuit for adjusting the value of the voltage to be applied to the bias terminal is required, so that the circuit scale of the attenuator is increased. In addition, since the attenuation characteristic of the attenuator is adjusted by the voltage to be applied to the terminal in Patent Document 1, a thermal noise and a shot noise may in some cases be mixed in an output signal of the attenuator, the thermal noise and the shot noise being turbulence of a voltage signal caused by the random motion of electric charges to be superimposed on the applied voltage. Since a receiving circuit of communications equipment is not to handle a signal having a high gain, the noise component has a great influence on a signal. For this reason, it is required that the receiving circuit have a circuit configuration of not generating a noise as much as possible.

SUMMARY

An attenuator according to the present invention includes: a T-type two terminal pair network including first and second terminals, first, second and third circuits, wherein said first terminal receives an input signal to be attenuated, wherein said first circuit is connected between said first and second terminals, wherein said second circuit is connected between said first circuit and said second terminal and is connected to said first circuit via a node, wherein said third circuit is connected to said node; and a capacitor connected to said node, wherein an amount of attenuation of said input signal is adjusted by a capacitance value of said capacitor. This capacitor is a shunt capacitor.

This shunt capacitor shunts an input signal of the attenuator. A current component to be shunted increases or decreases depending on a capacitance value of the shunt capacitor, since the amount of current flowing through the shunt capacitor is proportional to the capacitance value of the shunt capacitor. If a shunt capacitor having a large capacitance value is connected, the current component to be shunted becomes large, and accordingly a current component that flows out from an output terminal of the attenuator decreases. If the current component that flows out from the output terminal of the attenuator decreases, the amount of attenuation of the gain of the input signal increases since a gain of an output signal of the attenuator decreases. Conversely, if a shunt capacitance having a small capacitance value is connected, the current component to be shunted decreases, and a current component that flows out from the output terminal of the attenuator increases. If the current component that flows out from the output terminal of the attenuator increases, the amount of attenuation of the gain of the input signal decreases since a gain of an output signal of the attenuator increases. In this manner, according to the present invention, the attenuation characteristic of the attenuator is adjusted by using the capacitance component. Since the scale of the capacitance element is small as compared with a step-down circuit, the present invention can also prevent the circuit scale of the attenuator from being increased. Furthermore, in the present invention, since the attenuation characteristic of the attenuator is not adjusted by applying a voltage itself to a terminal of the attenuator, the attenuator can prevent the output signal of the attenuator from being mixed with a thermal noise and a shot noise.

The present invention exhibits the following effects: an attenuator that adjusts the attenuation characteristics of the attenuator and has a good attenuation characteristic can be designed; the circuit scale of the attenuator can be prevented from being increased; and an unnecessary noise component can be prevented from being mixed with an output signal of the attenuator.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

FIRST EXAMPLE

Figure 1:
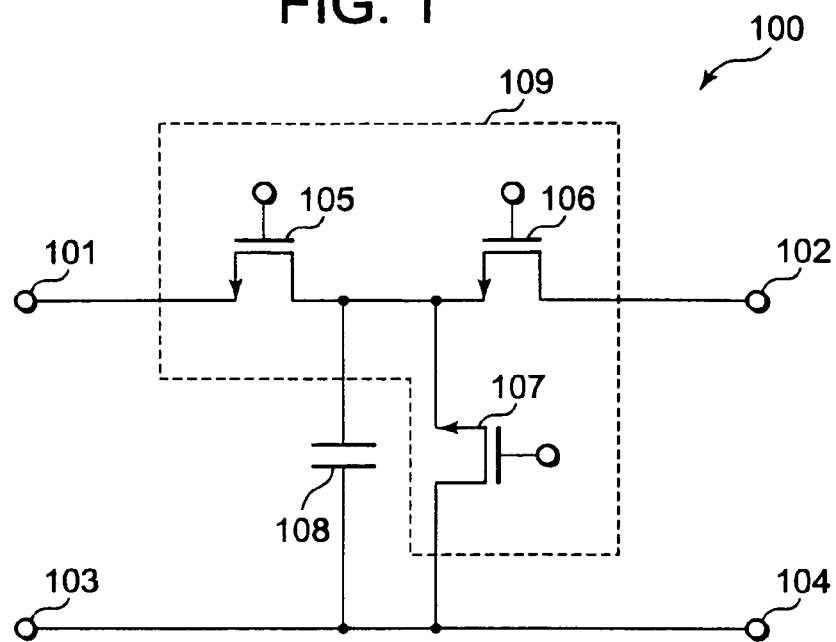
FIG. 1 shows an attenuator according to a first embodiment of the present invention.

Embodiments of the present invention will be described below with reference to the accompanying drawings. FIG. 1 shows an attenuator 100 according to an embodiment of the present invention. The attenuator 100 is a two terminal pair network (two-port circuit) that includes a circuit element between ports composed of terminals 101 and 103, and ports composed of terminals 102 and 104. The attenuator 100 includes Metal-Oxide-Semiconductor (MOS) transistors 105 and 106 which are a kind of a field-effect transistor. The transistors 105 and 106 are connected in series between the terminal 101 and the terminal 103, as examples of a first circuit and a second circuit respectively. The attenuator 100 further includes a MOS transistor 107 connected in shunt between the MOS transistors 105 and 106. A circuit 109 formed of the MOS transistors 105 to 107 is a typical T-type attenuator formed of the MOS transistors. Further, a capacitance element 108 is connected in shunt between the MOS transistors 105 and 106, which are in the T-type attenuator. Since the MOS transistor 107 and the capacitance element 108 are shunt components in the two terminal pair network, they are also connected to an interconnection that connects between the terminal 103 and the terminal 104. A value of the capacitance element 108 can be set to 20 [fF], for example. These MOS transistors are typically n-type MOS transistors, however, the MOS transistors may be p-type MOS transistors. Each of the MOS transistors 105 to 107 includes a gate terminal.

Figure 2:
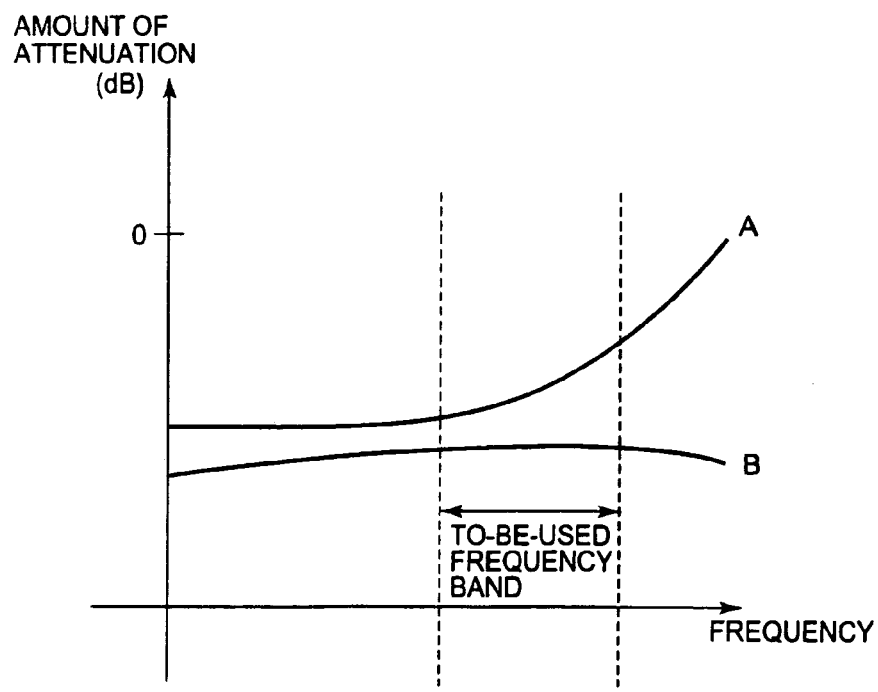
FIG. 2 is a graph for explaining an example of an attenuation characteristic of the attenuator.

FIG. 2 shows the attenuation characteristic of the attenuator 100 in FIG. 1 and that of the circuit 109, i.e., the attenuator 100 in FIG. 1 from which the capacitance element 108 is removed. "A" in FIG. 2 denotes the attenuation characteristic of the attenuator (circuit 109), i.e., the attenuator 100 described in FIG. 1 from which the capacitance element is removed. "B" in FIG. 2 denotes the attenuation characteristic of the attenuator 100. The vertical axis shows an amount of attenuation, i.e., the ratio of a gain of an output signal to a gain of an input signal of the attenuator (represented by decibel (dB)). The horizontal axis shows frequencies of the input signals to the respective attenuators. As apparent from FIG. 2, the attenuator 100 having the attenuation characteristic B has a larger amount of attenuation than the circuit 109 having the attenuation characteristic A. This is because the input signal is shunted via the capacitance element 108, so that a current value of the output signal is lowered in the attenuator 100. In this manner, the attenuator 100, in which the capacitance element 108 is added to the T-type attenuator of the circuit 109, can adjust the attenuation characteristic. Furthermore, the attenuator 100 having the attenuation characteristic B is capable of keeping the amount of attenuation at an approximate constant value even if the frequency of the input signal increases. On the other hand, as the frequency of the input signal increases, the amount of attenuation of the gain of the input signal largely decreases in the circuit 109 having the attenuation characteristic A. A "to-be-used frequency band" shown in FIG. 2 shows the frequency range of signals to be received in a receiving circuit relating to communications that use a wide-band high-frequency signal, such as a UWB communications system. To take a specific example, assume a lower limit of the to-be-used frequency band is 3 GHz and an upper limit thereof is 5 GHz. In this case, the attenuator 100 having the attenuation characteristic B keeps the amount of attenuation at an approximate constant value regardless of the frequency of the input signal in the to-be-used frequency band, while the circuit 109 having the attenuation characteristic A has large decreases in the amount of attenuation in the to-be-used frequency band as the frequency of the input signal increases. For this reason, when the circuit 109 having the attenuation characteristic A receives a signal in the "to-be-used frequency band" in FIG. 2, the amount of attenuation largely varies depending on the frequency of the received signal. Thus, in the communications using the wide band frequency signals, such as the UWB communications, the circuit configuration of a low noise amplifier that is located in the latter part of the attenuator becomes complicated. In this manner, the attenuator 100 in which the capacitance element 108 is added to the T-type attenuator of the circuit 109, can adjust the attenuation characteristic and improve the attenuation characteristic.

Figure 3:
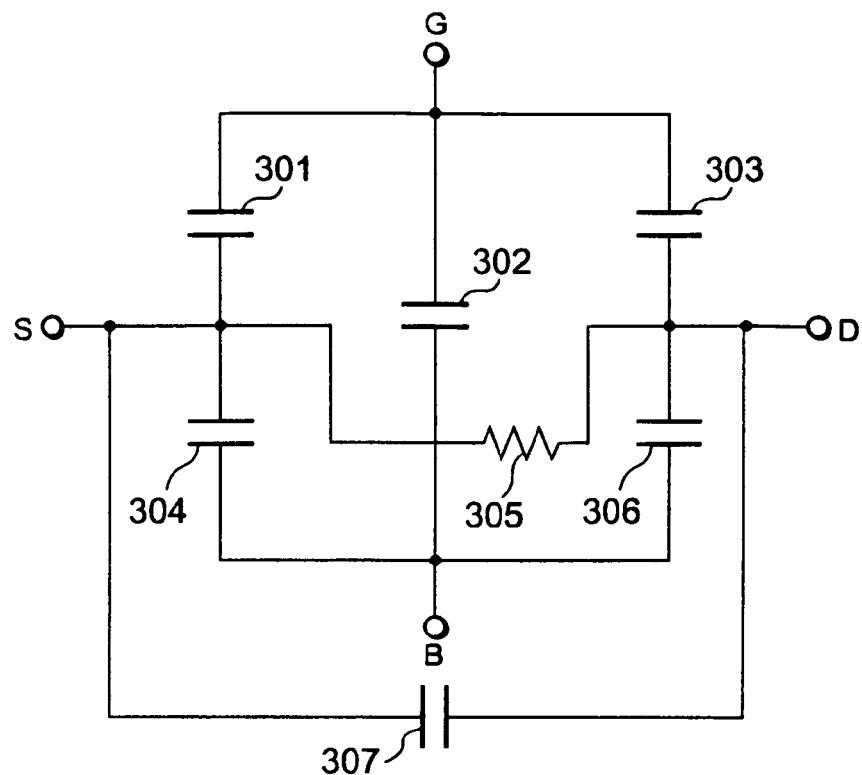
FIG. 3 shows a high-frequency equivalent circuit of a MOS transistor.

Here, the reason why the amount of attenuation of the attenuator changes depending on the frequency of the input signal will be described. FIG. 3 shows a high-frequency equivalent circuit of the MOS transistor that is one component of the attenuator 100 according to FIG. 1. The MOS transistor includes three electrodes of a source (S), a drain (D), and a gate (G), and among terminals of the electrodes, a parasitic capacitance component is present. For example, a capacitor 301 is a parasitic capacitance generated between the gate electrode and the source electrode of the MOS transistor; a capacitor 302, between the gate electrode and a substrate; a capacitor 303, between the gate electrode and the drain electrode; a capacitor 304, between the source electrode and the substrate; a capacitor 306, between the drain electrode and the substrate. Furthermore, a resistance 305 is a resistance component between the source electrode and the drain electrode. As described above, there are multiple, unavoidable parasitic capacitance components in the MOS transistor. Here, the attenuator 100 includes multiple MOS transistors as its circuit configuration. The attenuation characteristic of the attenuator 100 shown in FIG. 1 can be obtained by analyzing a frequency characteristic of S12 or S21 that is a diagonal element of a scattering matrix (S matrix). The values of these S12 and S21 change depending on the parasitic capacitance generated in the circuit and the frequency. As a result, the attenuation characteristic of the attenuator obtained by the S12 or the S21 also changes depending on the frequency of the input signal.

SECOND EXAMPLE

Figure 4:
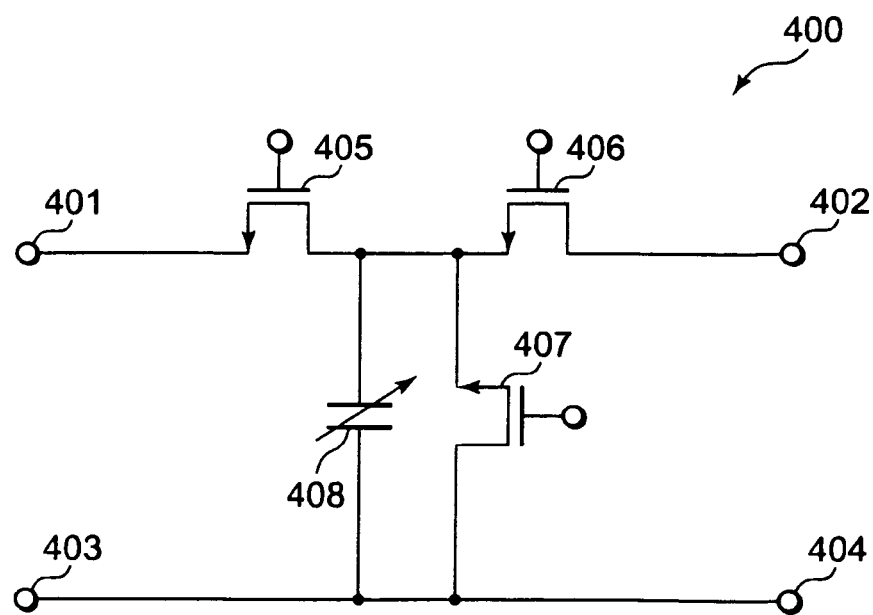
FIG. 4 shows an attenuator according to a second embodiment of the present invention.

FIG. 4 shows an attenuator 400 that employs a variable capacitance element 408 as the capacitance element of the attenuator 100 according to FIG. 1. Other circuit elements exclusive of the capacitance element 408 in the attenuator 400 have the same configuration as that of the attenuator 100.

Figure 5:
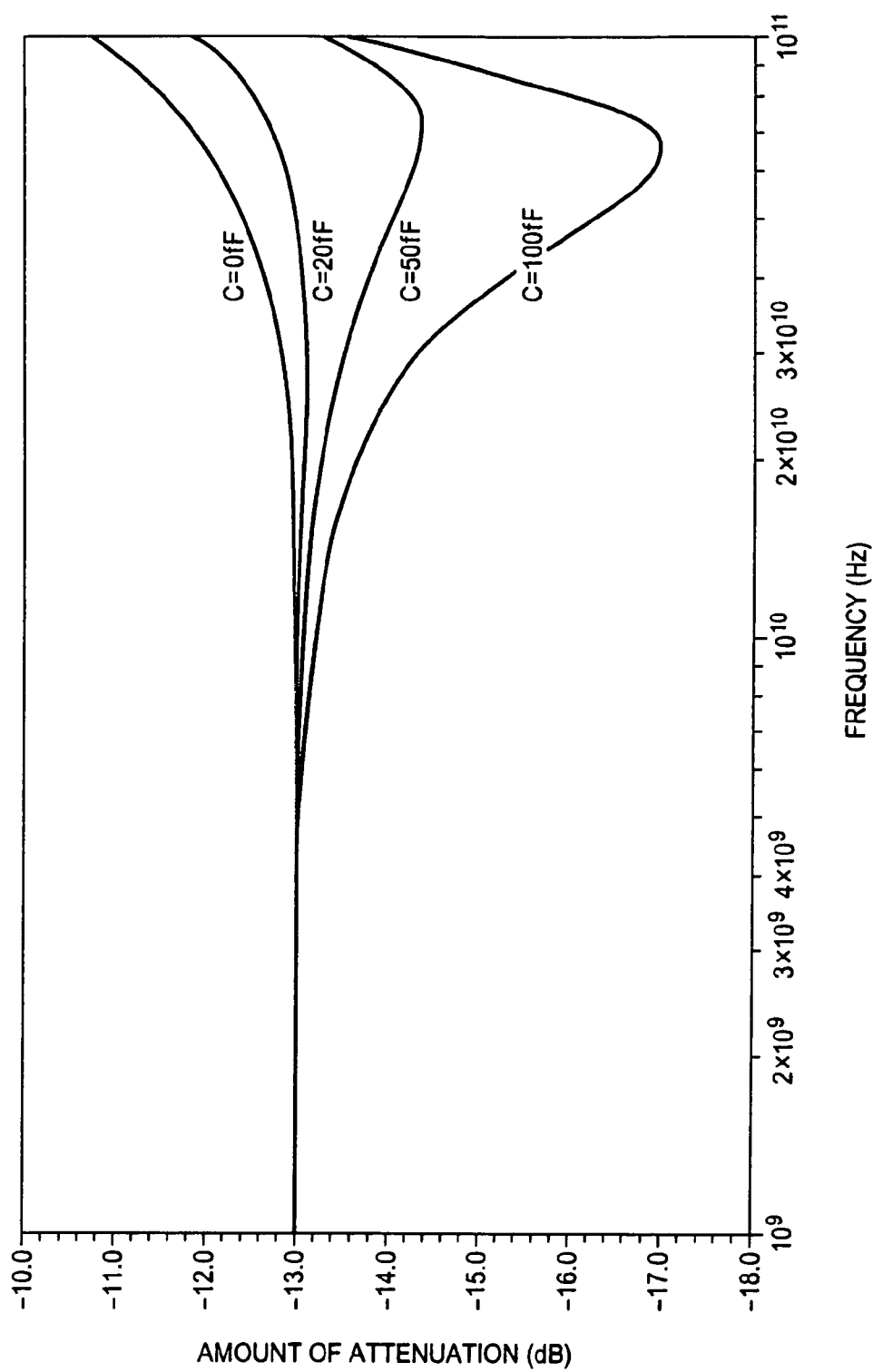
FIG. 5 shows a simulation result of the attenuation characteristic of the attenuator.

FIG. 5 shows a change in the attenuation characteristic of the attenuator 400 according to FIG. 4 constituted of MOS transistors 405 and 406, a MOS transistor 407, and the variable capacitance element 408, the change appearing when gate widths of the MOS transistors 405 and 406 are respectively set to 13.5 [μm], a gate width of the MOS transistor 407 is set to 18.2 [μm], and a capacitance value of the variable capacitance element 408 is varied among 0 [fF], 20 [fF], 50 [fF], and 100 [fF]. As apparent from FIG. 5, the capacitance value of the variable capacitance element 408 is varied so that the attenuation characteristic of the attenuator 400 can be adjusted. Referring to FIG. 5, when the value of the variable capacitance element 408 is set to 20 [fF], a flat attenuation characteristic can be achieved within the range of up to 5 GHz of the frequency of the input signal.

THIRD EXAMPLE

Figure 6:
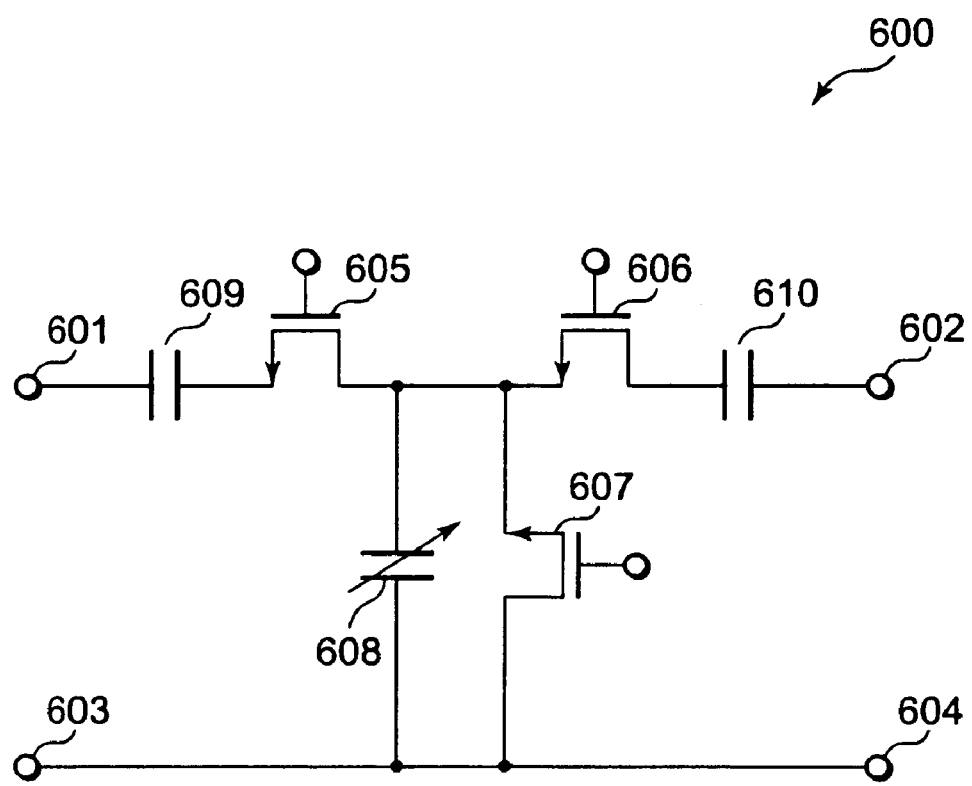
FIG. 6 shows an attenuator according to a third embodiment of the present invention.

FIG. 6 shows an attenuator 600 having a configuration in which two capacitance elements are further added to the attenuator 400 shown in FIG. 4. More specifically, the attenuator 600 includes MOS transistors 605, 606, and 607 and a variable capacitance element 608 that are the same circuit elements as those in the attenuator 400 of FIG. 4, and further includes new capacitance elements 609 and 610. The attenuator 600 includes the capacitance elements 609 and 610 in addition to the capacitance element 608. Thereby, an influence caused when the capacitance values of these capacitance elements vary at the time of manufacturing the attenuator 600 can be reduced, the influence being applied to the attenuation characteristic. As described above, the attenuation characteristic of the attenuator can be obtained by analyzing the frequency characteristic of S12 and S21 that are diagonal elements of the scattering matrix. One of the parameters that exert a large influence on the values of these S12 and S21 is the capacitance value of the capacitance element. Thus, the attenuator 600 is provided with multiple capacitance elements in the circuit so that a change caused by variation in the capacitance elements of S12 or S21 that are the diagonal elements of the scattering matrix can be reduced. S12 and S21 are fractional parameters. Thus, by providing the multiple capacitance elements in the circuit, terms that change depending on the capacitance value are included in both a denominator and a numerator of S12 or S21. Accordingly, even when the capacitance elements 608, 609, and 610 vary at the time of manufacturing the respective capacitance values, the change in S12 or S21 is canceled out by a change in the denominator and a change in the numerator. As a consequence, the attenuation characteristic that can be obtained from S12 or S21 does not largely change by the variation of the capacitance values of the capacitance elements 608, 609, and 610 at the time of manufacturing.

FOURTH EXAMPLE

Figure 7:
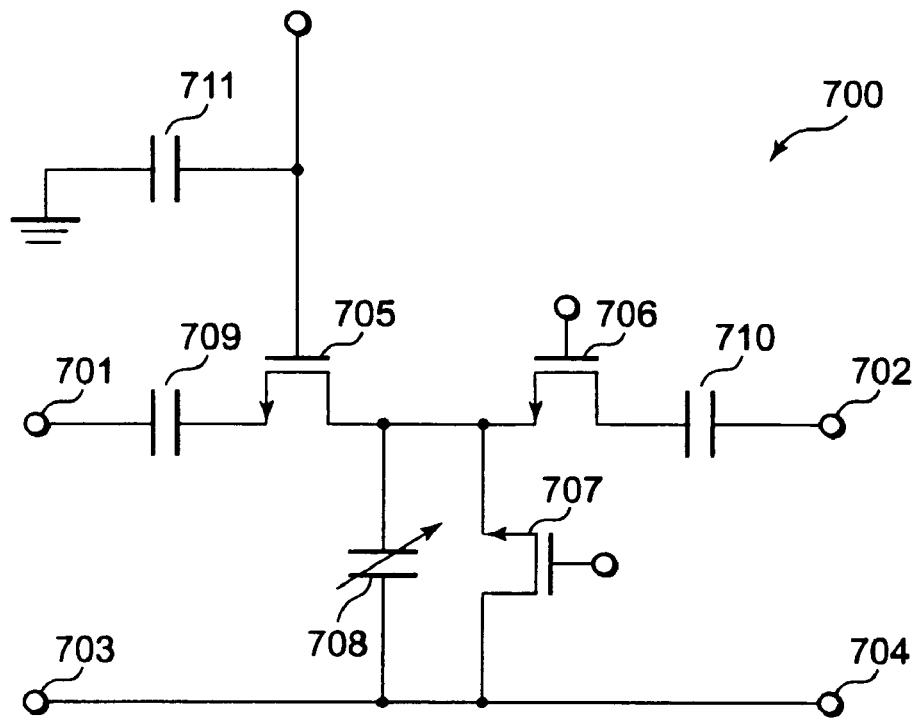
FIG. 7 is a diagram for explaining a parasitic capacitance generated in a gate connection.
Figure 8:
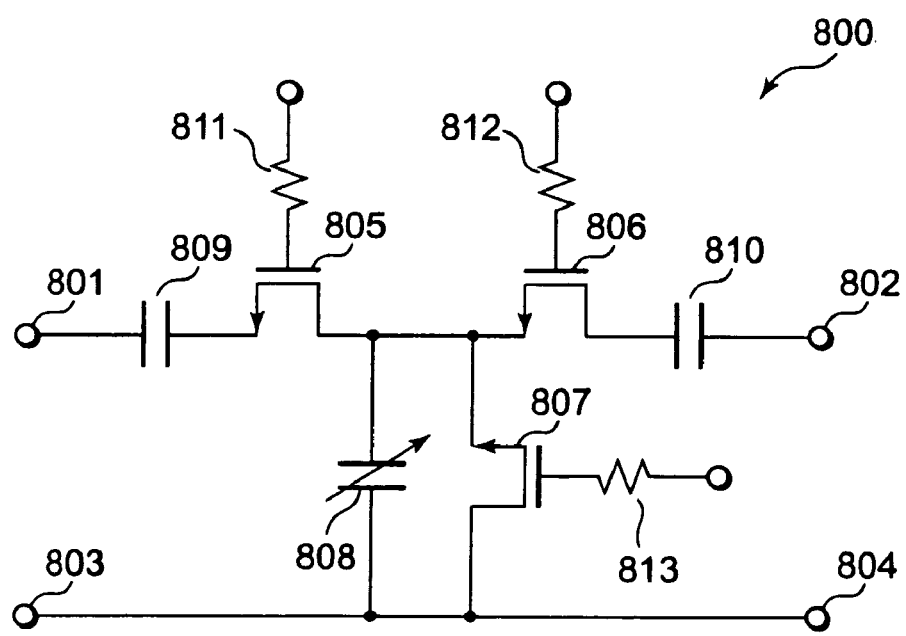
FIG. 8 shows an attenuator according to a fourth embodiment of the present invention.
Figure 12:
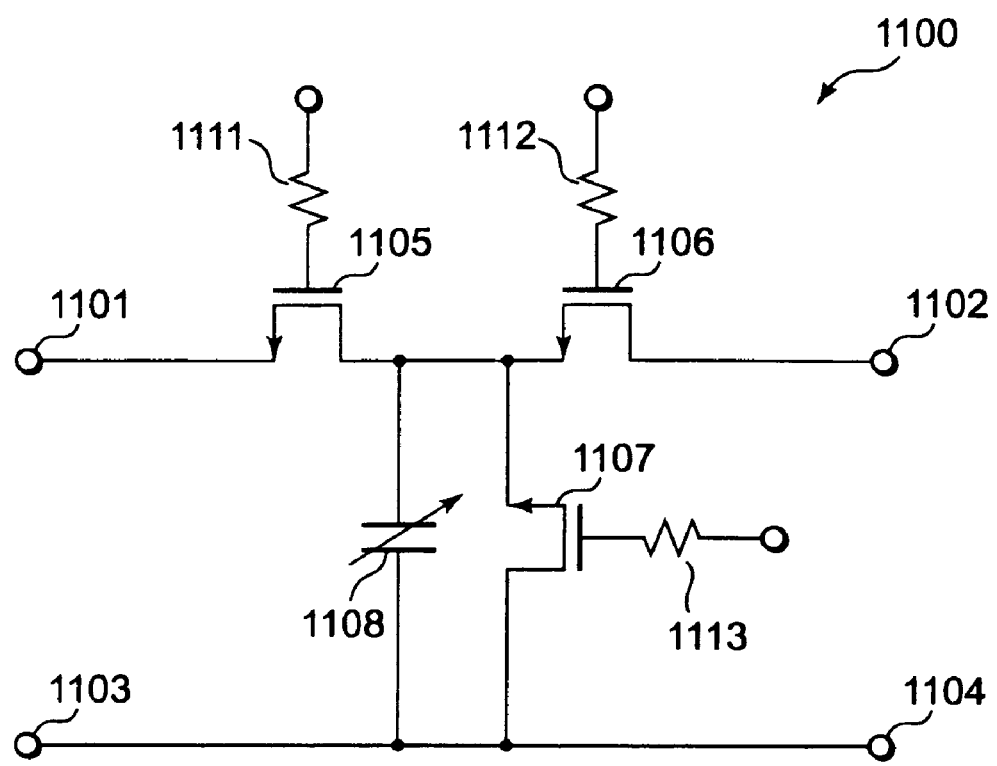
FIG. 12 shows an attenuator relating to the attenuator according to the fourth embodiment.

FIG. 7 shows an attenuator 700 in which a parasitic capacitor 711 is generated between a gate interconnection and a ground in the attenuator 600 shown in FIG. 6. In the attenuator, a parasitic capacitance is actually generated in the gate interconnection and the ground. Circuit elements exclusive of the parasitic capacitor 711 in the attenuator 700 are the same as those in the attenuator 600 shown in FIG. 6. The parasitic capacitor 711 exerts an influence on the attenuation characteristic of the attenuator 700. First, a part of an input signal received at a terminal 701 flows to a gate interconnection of a MOS transistor 705 via a parasitic capacitance generated between a gate electrode and a source electrode of the MOS transistor 705 (see, FIG. 3). Then, a leakage current that flows to the gate interconnection of the MOS transistor 705 flows toward the ground via the parasitic capacitor 711. Since the shunt current component of the input signal received at the terminal 701 increases, the amount of attenuation of the gain of the input signal possibly increases when the frequency of the input signal is high. However, a change in the attenuation characteristic caused by the parasitic capacitance should be avoided as much as possible. Accordingly, as a fourth embodiment, FIG. 8 shows an attenuator capable of reducing the leakage current component caused via the gate interconnection of the MOS transistor. In an attenuator 800 shown in FIG. 8, resistances 811, 812, and 813 are respectively connected to gate electrodes of MOS transistors 805, 806, and 807 that constitute the attenuator 800. The resistance value of each of the resistances 811, 812, and 813 is 1 [kΩ], for example. The resistance is connected to each of the gate electrodes of the MOS transistors 805, 806, and 807 so that the input signal received at a terminal 801 can be prevented from being leaked via each of the gate interconnections of the MOS transistors 805, 806, and 807. Note that, the attenuator 800 shown in FIG. 8 includes capacitance elements 809 and 810. These capacitance elements 809 and 810 exhibit the same effect as that of the capacitance elements 609 and 610 included in the attenuator 600 according to FIG. 6, and are not essential components for preventing the input signal received at the terminal 801 from being leaked via each of the gate interconnections of the MOS transistors 805, 806, and 807. In other words, the configuration without including capacitance elements can also be employed, as shown in FIG. 12.

FIFTH EXAMPLE

Figure 9:
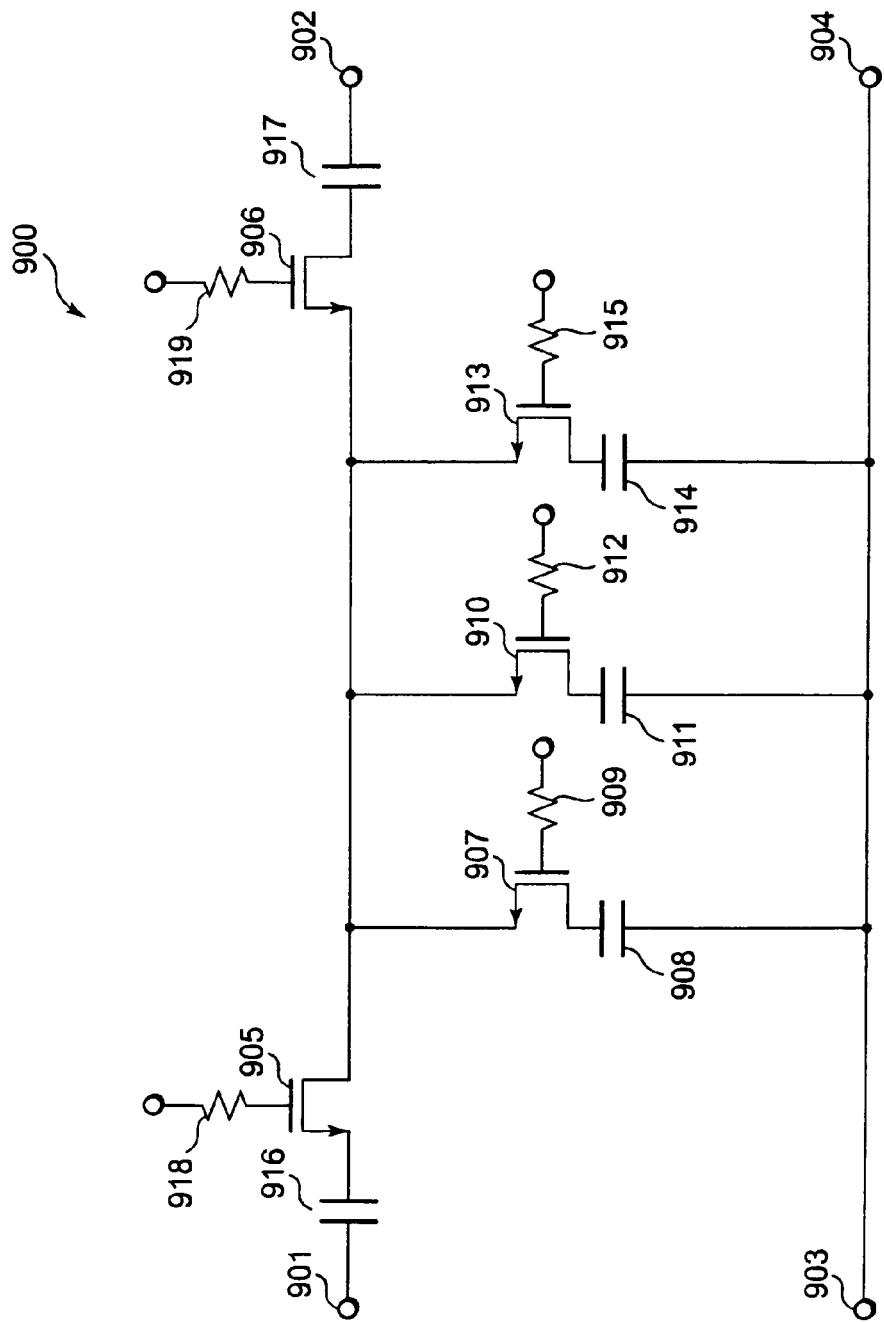
FIG. 9 shows an attenuator according to a fifth embodiment of the present invention.

FIG. 9 shows an example that realizes the function of a variable capacitance element 808 in the attenuator 800 according to FIG. 8 by replacing it with the MOS transistor. An attenuator 900 shown in FIG. 9 includes MOS transistors 907, 910, and 913, and capacitance elements 908, 911 and, 914 that are connected in series to these MOS transistors 907, 910, and 913, respectively. The voltage to be applied to each of the gate electrodes of the MOS transistors 907, 910, and 913 is controlled to thereby change the number of the MOS transistors in which the source and the drain are conducted with each other, thus realizing the variable capacitance element. The large number of the MOS transistors among the MOS transistors 907, 910, and 913 in which the source and the drain are conducted with each other, makes the input signal component to be shunted large. This means that the capacitance value of the variable capacitance element 808 in FIG. 8 increases equivalently. On the contrary, the small number of the MOS transistors among the MOS transistors 907, 910, and 913 in which the source and the drain are conducted with each other, makes the input signal component to be shunted small. This means that the capacitance value of the variable capacitance element 808 in FIG. 8 decreases equivalently. Note that, in FIG. 9, the three MOS transistors 907, 910, and 913 contribute to realize the equivalent variable capacitance element, and the three capacitance elements 908, 911 and, 914 contribute to realize the equivalent variable capacitance element. However, the number of the MOS transistors and that of the capacitance elements are not limited to three. For example, a circuit designer can select the number of the MOS transistors and that of the capacitance elements appropriately depending on the range of the capacitance value to be changed. Further, capacitance elements 916 and 917 exhibit the same effect as that of the capacitance elements 609 and 610 included in the attenuator 600 according to FIG. 6, and are not essential components to realize the equivalent variable capacitance. Furthermore, resistances 918 and 919 exhibit the same effect as that of the resistances 811 to 813 included in the attenuator 800 according to FIG. 8, and are not essential components to realize the equivalent variable capacitance.

SIXTH EXAMPLE

Figure 10:
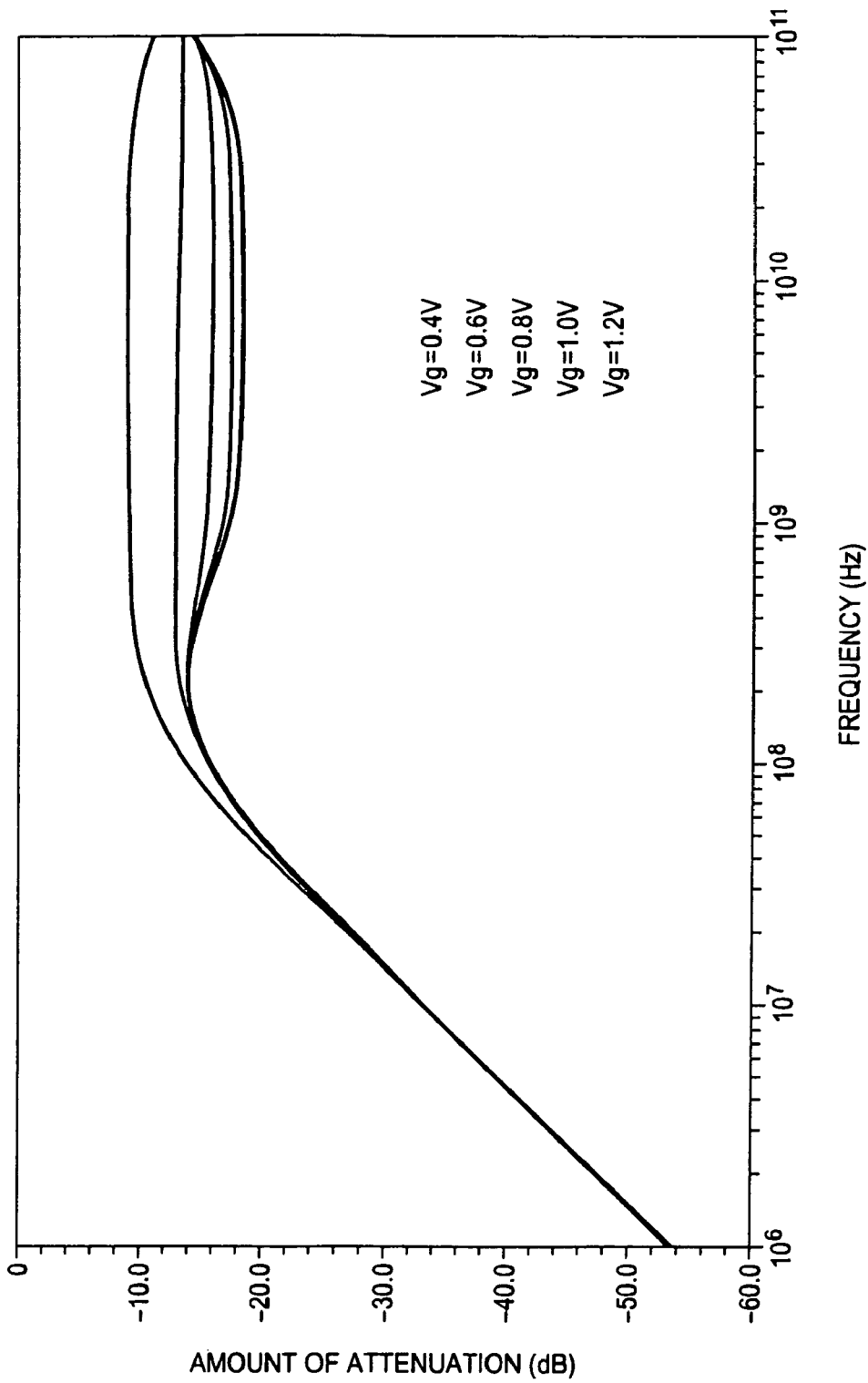
FIG. 10 shows a simulation result of an attenuator according to a sixth embodiment of the present invention.
Figure 11:
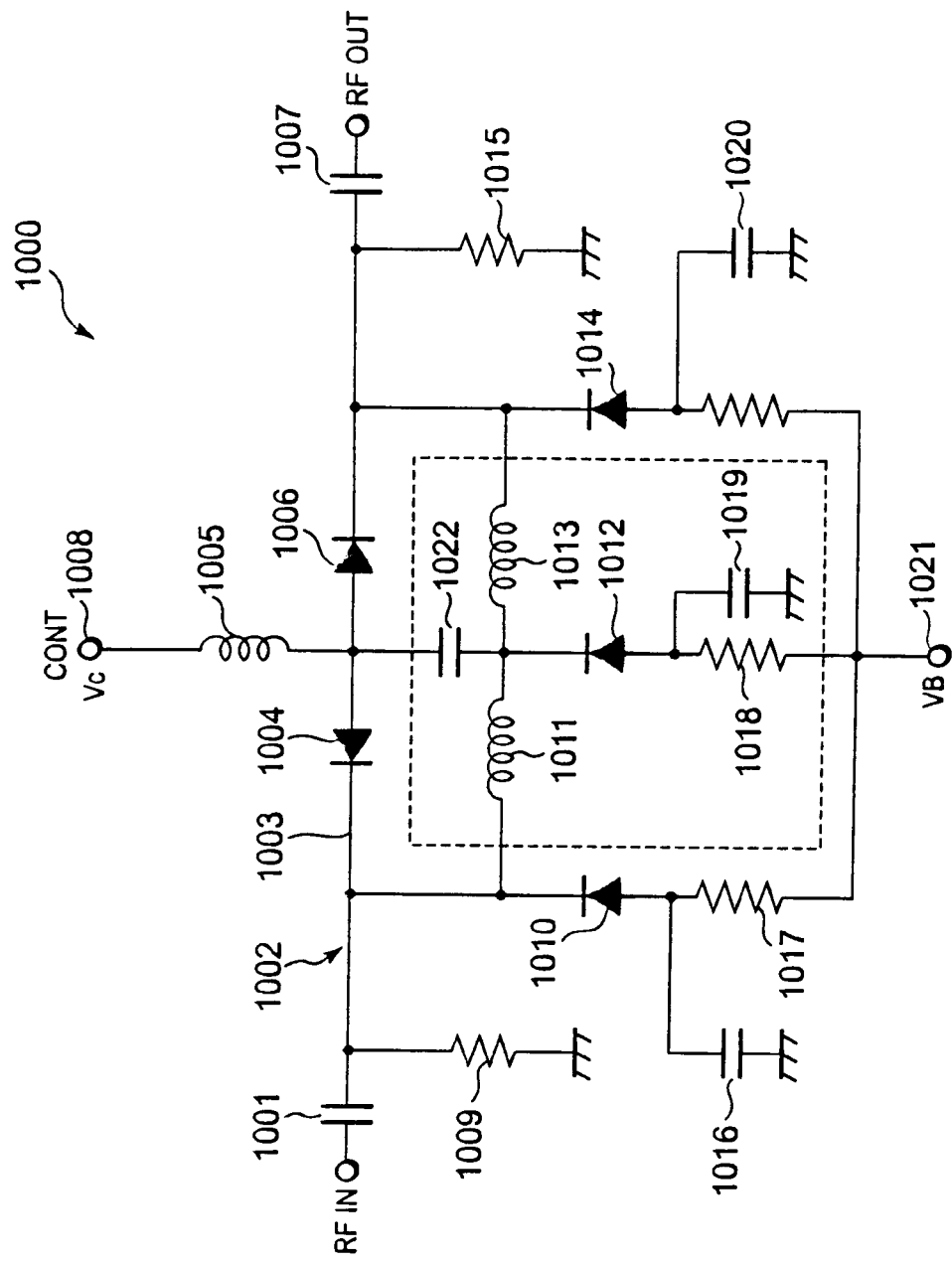
FIG. 11 shows a conventional attenuator.

It has been described that the attenuation characteristic of the attenuator is adjusted by the variable capacitance element. Additionally, there is an alternative method for adjusting the attenuation characteristic of the attenuator. In this method, the gate voltage of the MOS transistor is adjusted so that the ON-resistance value of the MOS transistor can be adjusted, thereby adjusting the attenuation characteristic of the attenuator. FIG. 10 shows how the attenuation characteristic of the T-type attenuator changes when the gate voltage of a MOS transistor that is connected in shunt in the MOS transistor that constitutes a T-type attenuator is changed. As shown in FIG. 10, the attenuation characteristic of the attenuator can also be adjusted by adjusting the ON-resistance of the MOS transistor.

Although it has been described by using the MOS transistor as the circuit element that constitutes an attenuator in the present embodiment described above, the attenuator can be formed of a circuit element other than the MOS transistor. Thus, the circuit element that constitutes the attenuator should not be limited to the MOS transistor.

It is apparent that the present invention is not limited to the above embodiments, but may be modified and changed without departing from the scope and spirit of the invention.

What is claimed is:

1. An attenuator comprising:
   a first terminal;
   a second terminal;
   a first circuit coupled between said first and second terminals and including a field effect transistor comprising a gate terminal coupled to a resistor;
   a second circuit coupled between said first circuit and said second terminal and coupled to said first circuit via a node;
   a third circuit coupled to said node; and
   a capacitor coupled to said node, a capacitance value of said capacitor being variable.

2. The attenuator according to claim 1, further comprising another field effect transistor coupled between the capacitor and the node and comprising a gate terminal coupled to another resistor.

3. The attenuator according to claim 1, further comprising a capacitor coupled between said first terminal and said first circuit.

4. The attenuator according to claim 3, further comprising another capacitor coupled between said second circuit and said second terminal.

5. The attenuator according to claim 1, wherein the second circuit includes another field effect transistor comprising a gate terminal coupled to another resistor.

6. The attenuator according to claim 5, wherein the third circuit includes yet another field effect transistor comprising a gate terminal coupled to yet another resistor.

* * * * *